United States Patent [19]
Aomori et al.

[11] Patent Number: 5,390,079
[45] Date of Patent: Feb. 14, 1995

[54] TAPE CARRIER PACKAGE

[75] Inventors: Kokichi Aomori, Chiba; Michiharu Honda; Toshihiro Okabe, both of Kanagawa, all of Japan

[73] Assignee: Hitachi, Ltd., Tokyo, Japan

[21] Appl. No.: 942,706

[22] Filed: Sep. 9, 1992

[30] Foreign Application Priority Data

Sep. 10, 1991 [JP] Japan .................. 3-230387

[51] Int. Cl.$^6$ ............................................. H05K 1/00
[52] U.S. Cl. .................. 361/749; 257/674; 257/675; 361/723; 361/690; 361/704
[58] Field of Search ................ 174/16.3, 254; 257/668, 257/669, 671, 674–677; 361/383, 386–389, 398, 400, 401, 408, 421; 437/206, 220; 439/71

[56] References Cited

U.S. PATENT DOCUMENTS

| | | | |
|---|---|---|---|
| 3,984,739 | 10/1976 | Mochizuki et al. | 361/398 |
| 4,796,080 | 1/1989 | Phy | 257/676 |
| 4,926,548 | 5/1990 | Hopkins et al. | 29/860 |
| 4,934,582 | 6/1990 | Bertram et al. | 228/191 |
| 4,967,261 | 10/1990 | Niki et al. | 257/674 |
| 4,983,804 | 1/1991 | Chan et al. | 219/85.11 |
| 5,018,005 | 5/1991 | Lin et al. | 361/398 |
| 5,057,456 | 10/1991 | Dehaine | 437/206 |

FOREIGN PATENT DOCUMENTS

| | | |
|---|---|---|
| 0113895A1 | 7/1984 | European Pat. Off. . |
| 0331814A2 | 9/1989 | European Pat. Off. . |
| 0432825A1 | 6/1991 | European Pat. Off. . |
| 3814469A1 | 11/1988 | Germany . |
| 4076745 | 3/1989 | Japan .................. 257/674 |
| 1-258436A | 10/1989 | Japan . |
| 2-150044A | 6/1990 | Japan . |
| 2205063 | 8/1990 | Japan .................. 257/674 |
| 1209901 | 10/1970 | United Kingdom .......... 439/71 |

OTHER PUBLICATIONS

Auletta, "Plastic-Dual-In-Line Film Module", IBM Tech Dis. Bulletin, vol. 17, No. 7, Dec. 1974, p. 1893.
Gero Zschimmer, "Impulslöten-die Alternative für SMDs", Elektronik, vol. 25, pp. 57–64, Dec. 12, 1986.
IBM Corp., "Flexible Film Interlead Support", IBM Technical Disclosure Bulletin, vol. 32 No. 8A; 332–333 (1990).
IBM Corp., "Laser Microwelding of Tape Automatel Bonding Components For Surface-mounted Technologies", vol. 31, No. 6, pp. 385–389 (1988).
IBM Corp., "Hybrid Thermode For Solder Attach", vol. 33, No. 2; 175–176 (1990).

*Primary Examiner*—Gregory D. Thompson
*Attorney, Agent, or Firm*—Pennie & Edmonds

[57] ABSTRACT

A tape carrier package has a base film and leads formed on one side of the base film. The base film defines a device hole therein, while the leads have outer portions to be bonded to a substrate and inner lead portions extending into the device hole. The tape carrier package can be mounted on a substrate by applying a high-frequency electromagnetic field to a portion of each lead which is to be bonded to the substrate, whereby solder applied to the lead or substrate in advance is heated and melted to bond the package to the substrate.

2 Claims, 6 Drawing Sheets

TAPE CARRIER PACKAGE

BACKGROUND OF THE INVENTION

1) Field of the Invention

This invention relates to a tape carrier package, a mounting process thereof and a mounter therefor.

2) Description of the Related Art

The basic technique of tape carrier packages (TCPs) is disclosed in U.S. Pat. No. 3,689,991, which is incorporated herein by reference.

The fundamental structure of the TCP available now on the market follows the above U.S. patent. The TCP disclosed in the above U.S. patent comprises a device hole for mounting a chip, namely, a semiconductor integrated circuit device therein, inner leads extending into the device hole, an outer lead hole for exposing outer leads for use in mounting the TCP on a substrate, conductors connecting the inner leads and the outer leads and a flexible resin tape supporting the conductors thereon. The above U.S. patent also states that the outer leads extend over the outer lead hole.

TCPs based on the technique of the above U.S. patent are used in electronic calculators, watches, liquid crystal displays and the like, and their applications are spreading further. For semiconductor circuit devices in industrial equipment such as computers, higher integration and scale enlargement as well as high-density mounting are required. Conventional pin grid arrays (PGAs) or quad flat packages (QFPs) are therefore facing increasing difficulties in meeting such requirements, resulting in a tendency toward the adoption of TCPs which permit high-density mounting.

To bond a TCP to a substrate, thermocompressing bonding is commonly employed. According to this bonding method, the TCP is placed at a prescribed location on the substrate, and a hot heating tool is then pressed against each outer lead exposed in an outer lead hole so that solder applied in advance to the lead or the substrate is melted to bond the TCP to the substrate.

This conventional technique, however, involves a potential problem that, when the heating tool is pressed against individual outer leads, differences may arise in the melting time of the solder among the leads due to warpage or the like of the tape. A horizontal force may then be produced so that the leads would be shifted relative to the substrate and, in some instances, would contact an adjacent pad. In addition, due to the narrow and thin configurations of the outer leads, the leads may be deformed upon thermocompression bonding.

Because of this, the conventional technique is accompanied by the problem that the yield becomes low when multipin, narrow-pitch TCPs are mounted on substrates. This problem is particularly serious in industrial equipment such as computers as these types of industrial equipment use multipin, narrow-pitch TCPs.

SUMMARY OF THE INVENTION

An object of this invention is to provide a TCP mounting process capable of preventing a reduction in the yield.

The present invention has achieved the above object. In a first aspect of the present invention, there is provided a tape carrier package which comprises a base film defining a device hole therein, leads formed on one side of the base film, the leads having outer lead portions to be bonded to a substrate and inner lead portions extending into the device hole.

The leads may preferably be twisted on the base film.

Preferably, the base film defines therein at least one outer lead hole adjacent to the device hole, and the outer lead portions extend over the outer lead hole and have lead reinforcement members on the surfaces that are opposite to the lead surfaces that the outer lead portions are to be bonded to the substrate.

Further, the lead reinforcement members may entirely cover the outer lead hole.

The lead reinforcement members disposed on the individual outer lead portion may be integrated together.

The lead reinforcement members may be transparent materials.

In addition, the lead reinforcement member may define at least one positioning hole therein.

Preferably, the leads are formed on a first side of said base film; the package further comprises a support member arranged on the base film that is arranged on a second side of the portion of the base film that is between the inner lead portions and the outer lead portions. The support member may preferably surround the device hole.

Also preferably, the support member may be provided with a heat-dissipating fin, and is arranged in such a way that the support member can be kept in contact with a semiconductor integrated circuit device to be held in the device hole.

In a second aspect of this invention, there is also provided a mounting process for a tape carrier package, which comprises applying a high-frequency electromagnetic field from a side opposite to a surface of a substrate bondable portion of each lead, whereby solder applied to the lead or substrate in advance is heated and melted to bond the package to the substrate.

In a third aspect of this invention, there is also provided a high-frequency heated solder bonding apparatus which comprises an exciter means for generating a high-frequency magnetic field, a head means for releasing the high-frequency magnetic field, which has been generated by the exciter means, from a high-frequency magnetic field releasing surface thereof and applying the high-frequency magnetic field to a solder-coated part of an object to be bonded.

The head means may preferably not in contact with the solder-coated part of the object upon application of the high-frequency magnetic field.

The high-frequency magnetic field releasing surface is, for example, in the form of a quadrilateral or linear shape.

The lead reinforcement members provided on the sides of the lead surface that is opposite to the lead surface where the outer lead portions are to be bonded to the substrate can prevent variations of the intervals of the outer lead portions and deformations of the outer lead portions upon compression bonding.

The heating method of a solder by the application of a high-frequency electromagnetic field causes solder, which has been applied in advance on the outer leads or the substrate, to uniformly and efficiently melt even when the lead reinforcement members are provided.

If a hot heating tool were pressed as in the conventional art, the lead reinforcement members would serve as barriers against the conduction of heat so that the temperature of the heating tool would have to be raised in order to cause the solder to melt. This would result in melting of the lead reinforcement members or a reduction in their characteristics.

According to the present invention, it is possible to provide TCPs which are resistant to deformations or dislocations of outer leads. The present invention also provides a soldering process for TCPS, which practically makes it unnecessary to consider influence by heat upon soldering the TCPs. The present invention can also improve the yield upon use of TCPs advanced toward the inclusion of more pins and the reduction of the interlead pitch.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

The first aspect of the present invention will hereinafter be described specifically with reference to FIGS. 1 through 7.

Figure 1:
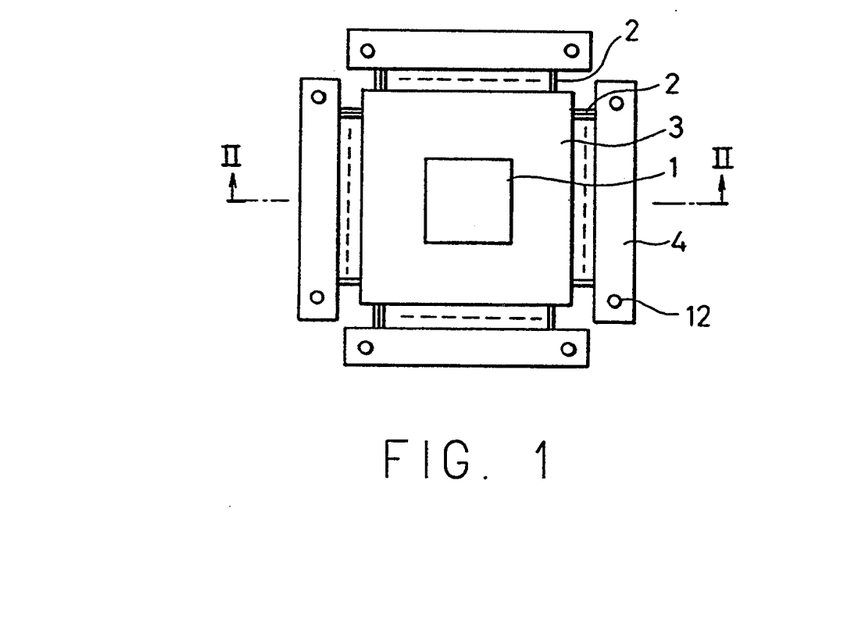
FIG. 1 is a plan view of a TCP according to a first embodiment of a first aspect of the present invention, in which leads have been shaped.
Figure 2:
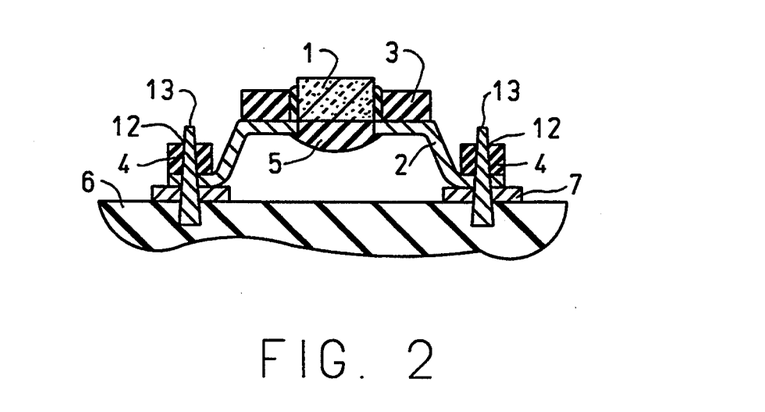
FIG. 2 is a cross-sectional view of the TCP, taken in the direction of arrows II—II of FIG. 1.

Referring first to FIGS. 1 and 2, a description will be made of the structure of the TCP according to the first embodiment of the present invention as viewed after its leads have been shaped.

A semiconductor integrated circuit device 1 has been subjected to thermocompression bonding (i.e., so-called inner bonding) on leads 2, and its surfaces are coated with a protective resin 5.

Leads 2 have been formed by etching a copper foil bonded to a film carrier tape as an insulator.

Figure 3:
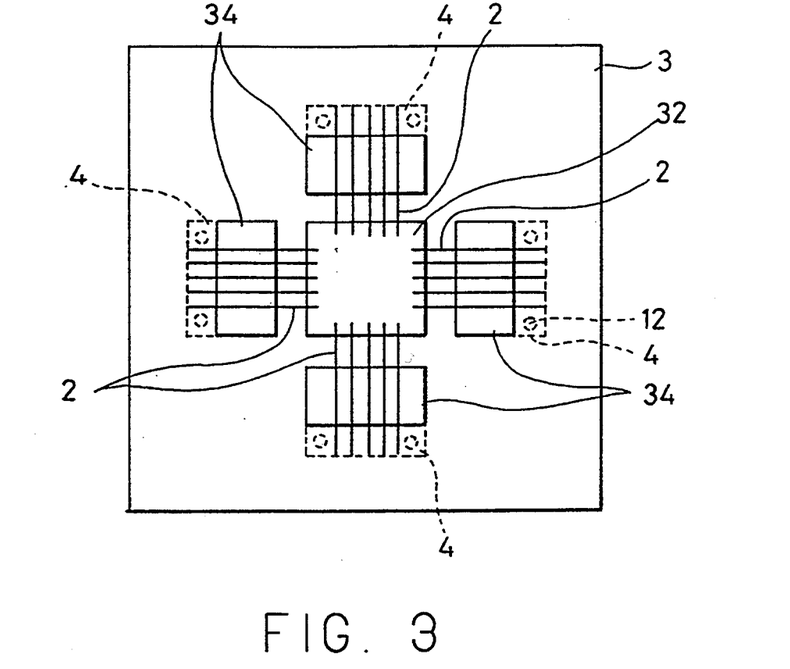
FIG. 3 is a schematic illustration of one example of a method for the formation of insulators 4.

The insulator, which is designated as numeral 3, is the aforementioned film carrier tape that still remains between a device hole 32 (see FIG. 3) and respective outer lead holes 34 (see FIG. 3). A polyimide resin is generally employed as the film carrier tape. This film carder tape is the "base film" as recited in the claims.

The present invention features the provision of additional insulators 4 as lead reinforcement members on respective outer lead portions. These insulators 4 were formed with ease by adjusting the dimensions of outer lead holes when the outer lead holes were formed by punching out the film carrier tape. Namely, as is illustrated in FIG. 3, the outer edge of each outer lead hole 34 is punched at a location shifted inwardly from its standard location (which is indicated by a dashed line in the drawing) so that the portion that remains between outer lead hole 34 and the dashed line is allowed to function as insulator 4. It is, however, to be noted that the method for the formation of the insulators 4 is not limited to this described method.

Positioning holes 12 are formed in opposite end portions of each insulator 4, where no outer leads are provided. Accurate positioning is therefore feasible by fitting these positioning holes 12 on their corresponding positioning studs 13 provided in advance on a substrate 6. This permits manual mounting without the need for a high-precision mounter. This advantage is particularly effective upon repair.

Owing to the provision of the insulators on the outer lead portions which are bonded to the substrate, variations of the intervals of the outer lead portions and deformations of the outer level portions can be prevented. Further, use of transparent film carrier tapes makes it possible to readily observe the state of bonding between the outer lead portions and the substrate from the outside, whereby the percentage of defects can be reduced.

To permit shaping, for example, bending of the leads 2 for the purpose of stress absorption, there are formed portions where the film carrier tape as an insulator is not present, namely, outer lead holes 34 which is between portions of the insulator 3, the portions surrounding the device hole 32, and the respective insulators 4. The insulator 3 and the insulators 4 can be integrated unless such shaping is performed. One example of such an modification will be described next as the second embodiment with reference to FIGS. 4 and 5.

Figure 5:
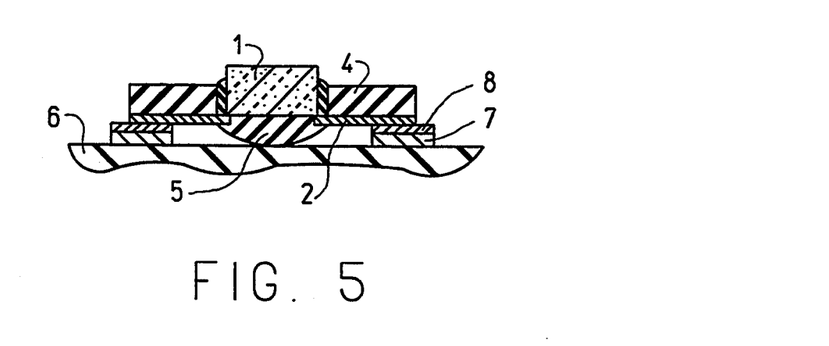
FIG. 5 is a cross-sectional view of the TCP according to the second embodiment of the first aspect of the present invention, taken in the direction of arrows V—V of FIG. 4.

The basic construction of the TCP according to the second embodiment is shown in FIG. 5.

Because leads 2 are not shaped in the second embodiment, insulator 3 and insulators 4, both shown in FIG. 1, can be integrated together without the need for their provision as discrete members. In an actual fabrication process, this can be achieved by omitting the outer lead holes.

Figure 4:
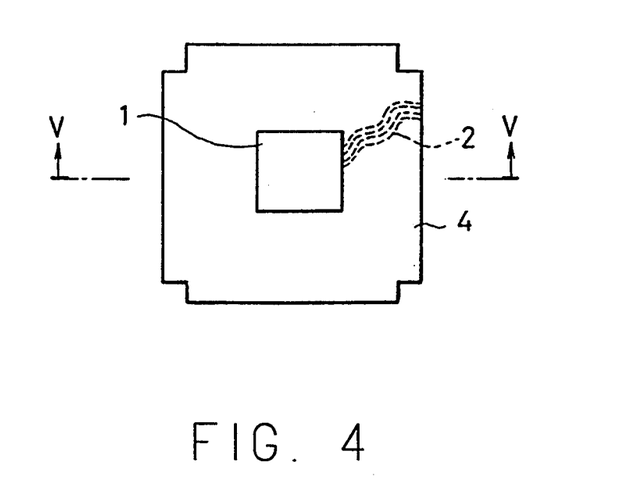
FIG. 4 is a plan view of a TCP according to a second embodiment of the first aspect of the present invention, which does not require shaping of leads.

In such a construction, it is preferable to shape leads 2 in a tortuous form in advance as depicted in FIG. 4 so that the leads 2 can absorb stress produced due to expansion and shrinkage at varied temperatures or the like. This can prevent the occurrence of cracks in solder 8 or the like via which leads 2 are connected to their corresponding pads 7.

Since the leads are completely covered by the insulator 4 in the second embodiment, the potential problem of short circuiting, corrosion or the like upon dew condensation has been overcome. Further, successful absorption of strain upon thermal expansion has obviated shaping, such as bending, of leads 2 (see FIG. 2). To fully ensure this advantage, it is convenient to leave leads 2 and insulator 4 partly unbonded without bonding them over the entire surfaces. Once the TCP has been mounted on a substrate 6, leads 2 are no longer exposed to the outside at any part thereof, thereby bringing about such an advantage that the potential problem of short circuiting between the leads due to the entrance of foreign matter can be substantially reduced.

Figure 6:
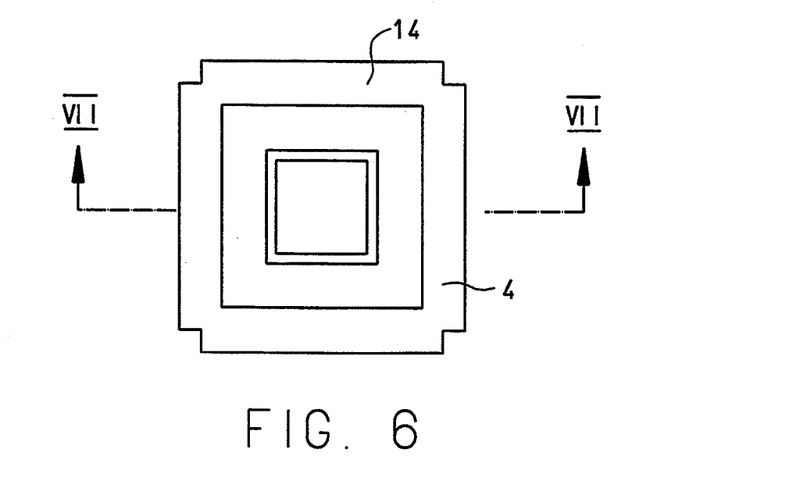
FIG. 6 is a plan view of a TCP according to a third embodiment of the first aspect of the present invention.
Figure 7:
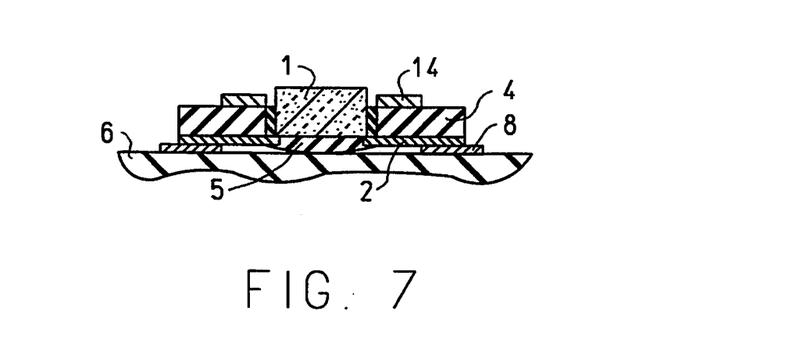
FIG. 7 is a cross-sectional view of the TCP according to the third embodiment of the first aspect of the present invention, taken in the direction of arrows VII—VII of FIG. 6.
Figure 8:
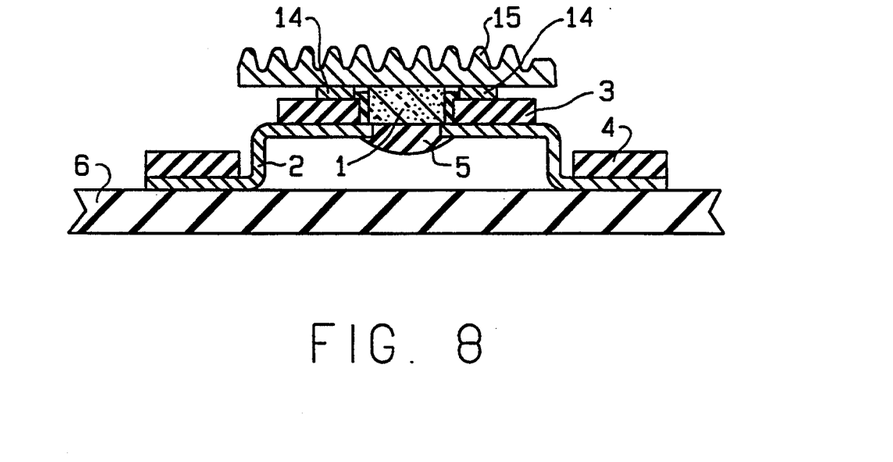
FIG. 8 is a schematic cross-sectional view showing a modification of the third embodiment of the first aspect of this invention, in which a heat-dissipating fin is provided via metal pieces.

The TCP according to the third embodiment of the present invention will next be described with reference to FIGS. 6 and 7. The third embodiment is basically similar to the second embodiment shown in FIGS. 4 and 5, but features the provision of a metal frame 14 on insulator 4. As a consequence, it is possible to avoid warpage or the like of the TCP. Provision of a heat-dissipating fin 15, which is shown in FIG. 8 as a modification of the first embodiment, on metal frame 14 (support member) in contact with semiconductor integrated circuit device 1 can enhance heat-dissipating effects for semiconductor integrated circuit device 1. As an alternative, metal frame 14 can be provided in contact with semiconductor integrated circuit device 1, thereby making metal frame 14 itself to function as a heat-dissipating member. Although metal frame 14 is used in the third embodiment, the frame may be made of any material other than metal as long as the material has high thermal conductivity.

If semiconductor integrated circuit device 1 with metal frame 14 in the third embodiment is to be soldered using a high-frequency heating tool as will be described subsequently, it is however necessary to arrange metal frame 14 at a location where no high-frequency magnetic flux will be applied to metal frame 14. This precaution is needed to avoid the generation of heat by an eddy current.

Figure 9:
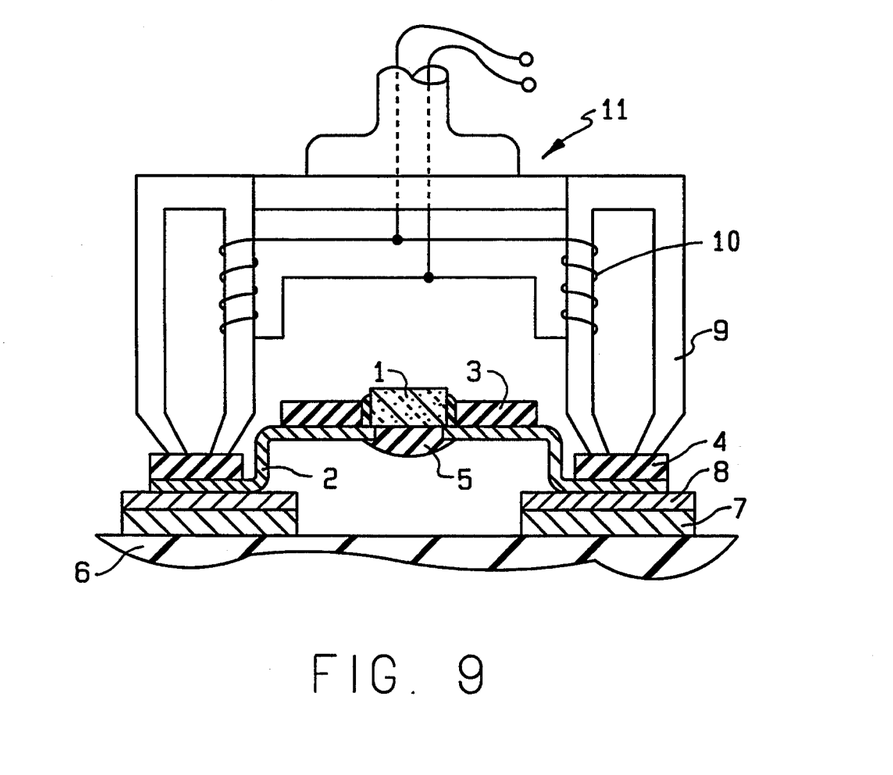
FIG. 9 is a simplified schematic illustration of a high-frequency heating tool according to a first embodiment of a second aspect of the present invention.

Referring next to FIG. 9, the high-frequency heating tool according to the first embodiment of the second aspect of the present invention will be described.

The high-frequency heating tool, which is generally designated at numeral 11, comprises exciter heads 9, exciter coils 10 wound up on exciter heads 9, respectively, and other structural elements.

Figure 10:
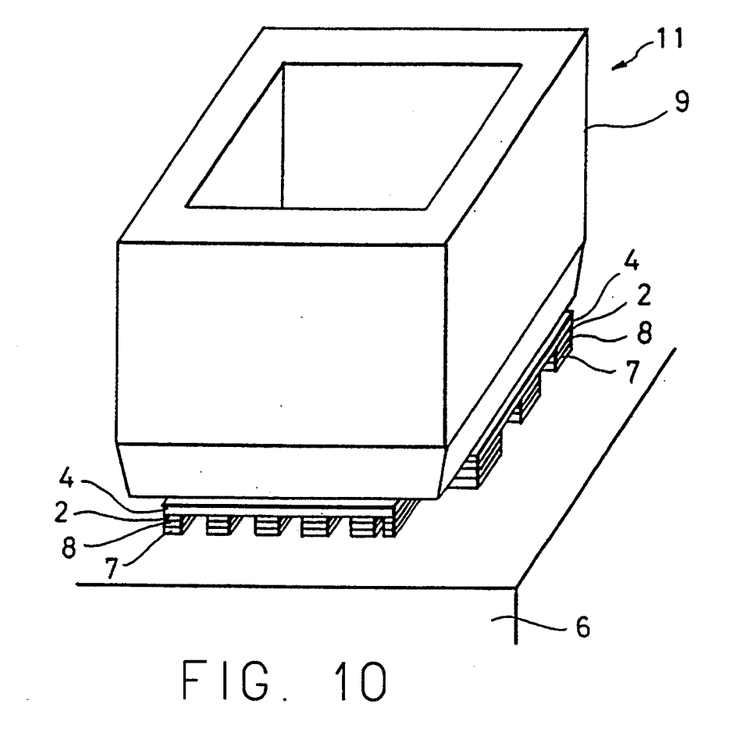
FIG. 10 is a schematic view showing a exciter heads being a quadrilateral shape.
Figure 11:
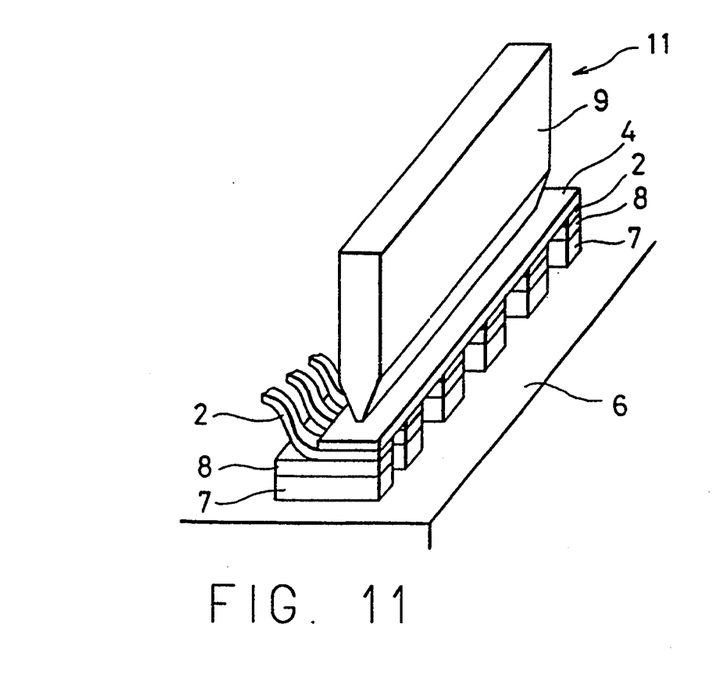
FIG. 11 is a schematic view showing a exciter heads being a linear shape.

By forming a magnetic flux releasing portion, namely, a gap portion at a free end of each exciter head 9 in a shape corresponding to the arrangement of plural outer lead portions to be bonded, these outer lead portions can be soldered in one operation. For example, the gap portion is formed in a quadrilateral shape (see FIG. 10) or linear shape (see FIG. 11) for general TCPs, namely, for TCPs having leads along four outer peripheral sides thereof.

A description will next be made of heating procedures and the principle of the heating.

It is a prerequisite that a substrate 6, on which a TCP is to be mounted, has been provided beforehand with a pad 7 for mounting the TCP thereon and a suitable amount of solder 8 has been applied in advance on pad 7. Advance application of solder on the leads can also bring about similar effects.

Positional registration between pad 7 and the TCP is first carried out using a high-prevision mounter with an image recognition system. Incidentally, where positioning holes 12 or the like described above with regard to the first embodiment of the first aspect of this invention have been provided, the above positional registration may be conducted manually.

Figure 12:
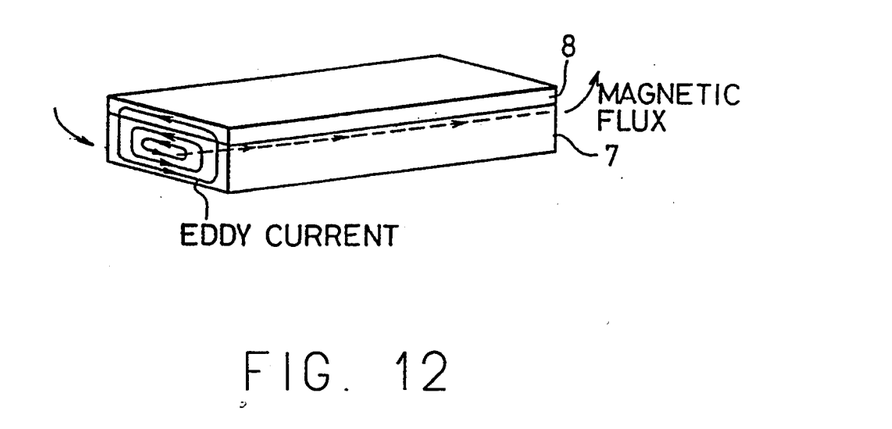
FIG. 12 is a schematic illustration of an eddy current induced by a magnetic flux and flowing through a pad and a solder.

Placing after exciter heads 9 over the leads to be soldered, a high-frequency alternating current is fed through exciter coils 10. Then, a high-frequency alternating magnetic flux is produced at each exciter head 9. The high-frequency alternating magnetic flux flows across the gap portion of exciter head 9 so that the high-frequency alternating magnetic flux travels through corresponding pad 7 and solder 8 as shown in FIG. 12. As a result, at the corresponding regions of pad 7 and solder 8, an eddy current flows in the direction such that the above change in magnetic flux can be canceled out.

As soon as eddy current flows, pad 7 and the solder 8 develop eddy-current losses due to their own resistance so that heat is produced there. As a result, it is possible to cause solder 8 to melt due to this heat. In this case, uniform heating is feasible in this embodiment owing to the heating principle of even if insulators 4 are present.

Figure 13:
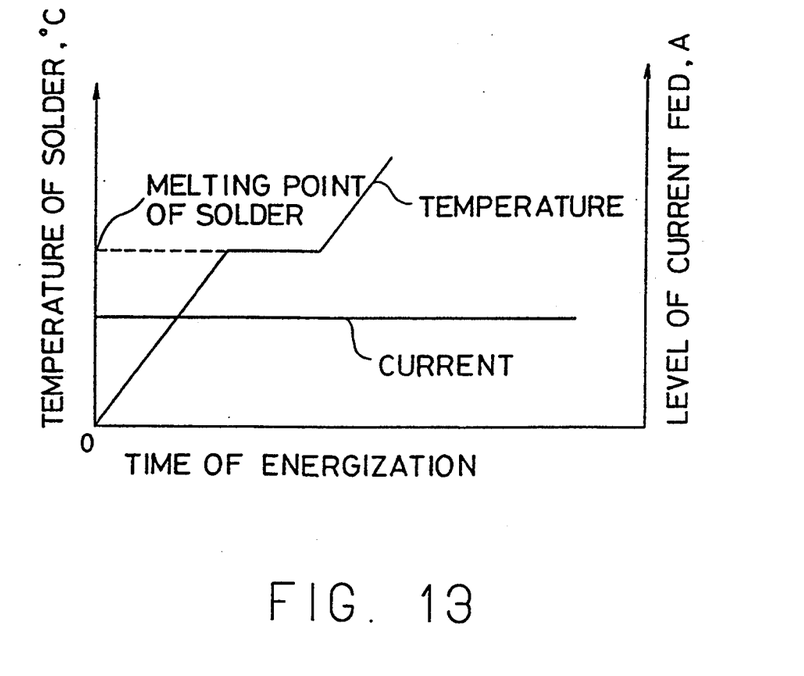
FIG. 13 is a diagrammatic representation showing a relationship between a current fed through an exciter coil and the temperature of solder.

Incidentally, the temperature of the solder at this time rises with the time of energization as shown in FIG. 13. It is observed that the temperature of the solder remains constant for a while. This corresponds to the melting point of the solder at which the solder transforms from a solid to a liquid.

As soon as energization of the exciter coils 10 is stopped after the solder has been melted, neither the high-frequency alternating magnetic flux nor the eddy current any longer exist. No heat is accordingly produced. The temperatures of the solder hence drops, whereby the soldered connection between leads 2 and pad 7 is completed.

The temperature increase of each exciter head 9 itself is almost negligibly small in the high-frequency heating tool 11 according to the first embodiment of the second aspect of this invention. The temperature of the solder can therefore drop easily so that the solder solidifys in a short time. If it is desired to further shorten the cooling time for the solder, high-frequency heating tool 11 can be modified into such a construction that cooling air can be blown against the gap portion of each exciter head 9. The temperature of the solder can be controlled in various ways. For example, it can be controlled by limiting the product of the level of a current fed and the time of its feeding to a predetermined value. As an alternative, the temperature of the solder is measured by an infrared thermometer or the like and the energization is stopped when the temperature has reached a predetermined level.

Although each exciter head 9 is pressed against its corresponding insulator 4 in FIG. 9, leads 2 are protected from deformation because it is not required, unlike a soldering iron or the like, to strongly press exciter head 9 for sufficient heat is pass. Owing to the heating principle, it is not absolutely necessary to bring the free end of each exciter head 9 into contact with lead 2. Arrangement of exciter head 9 with a slight space between exciter head 9 and lead 2 or insulator 4 permits soldering to more accurate positions by utilizing self-alignment action of the TCP owing to the surface tension of solder.

If the high-frequency heating tool 11 is used as a TCP-attracting head, in other words, if the magnetic field released from each exciter head 9 is used to attract corresponding leads 2 upon performing the positioning of the TCP by using the above-described high-precision mounter with the image recognition system, the outer lead portions can be held directly so that the warp of the TCP can be avoided or minimized. Further, when the warp of the TCP has already been made, the outer lead portions can be held directly so that the warp of the TCP can be corrected.

The TCP is provided with insulators 4 in the embodiment shown in FIG. 9. Needless to say, high-frequency heating tool 11 can also be applied to TCPs which are not provided with such insulators.

As has been described above, the use of the high-frequency heating tool according to the first embodiment of the second aspect of this invention can substantially improve the yield upon mounting multipin, narrow-pitch TCPs on substrates.

What is claimed is:

1. A tape carrier package comprising:
   a base film defining a device hole therein;
   leads formed on a first side of said base film, said leads having outer lead portions to be bonded to a substrate and inner lead portions extending into said device hole; and
   a support member arranged on a second side of the portion of said base film that is between said inner lead portions and said outer lead portions.
2. The package of claim 1 wherein said support member surrounds said device hole.

* * * * *